United States Patent
Noel et al.

(10) Patent No.: US 12,362,011 B2
(45) Date of Patent: Jul. 15, 2025

(54) SRAM WITH RECONFIGURABLE SETTING

(71) Applicant: COMMISSARIAT A L'ENERGIE ATOMIQUE ET AUX ENERGIES ALTERNATIVES, Paris (FR)

(72) Inventors: Jean-Philippe Noel, Grenoble (FR); Bastien Giraud, Grenoble (FR); Lorenzo Ciampolini, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 182 days.

(21) Appl. No.: 18/045,881

(22) Filed: Oct. 12, 2022

(65) Prior Publication Data

US 2023/0127142 A1    Apr. 27, 2023

(30) Foreign Application Priority Data

Oct. 25, 2021 (FR) ...................................... 21 11286

(51) Int. Cl.
*G11C 11/419* (2006.01)

(52) U.S. Cl.
CPC .................................. *G11C 11/419* (2013.01)

(58) Field of Classification Search
CPC ......... G11C 11/419; G11C 5/148; G11C 7/24; G11C 7/20
See application file for complete search history.

(56) References Cited

U.S. PATENT DOCUMENTS

| 6,108,232 | A | * | 8/2000 | Hennebois | ............ G11C 11/419 365/194 |
| 2008/0019162 | A1 | * | 1/2008 | Ogura | ................ G11C 14/0063 365/72 |
| 2018/0096172 | A1 | | 4/2018 | Lu | |
| 2019/0172526 | A1 | | 6/2019 | Noel et al. | |
| 2019/0392179 | A1 | | 12/2019 | Lu | |
| 2021/0233586 | A1 | * | 7/2021 | Tailliet | ............... G11C 14/0063 |
| 2022/0406370 | A1 | * | 12/2022 | Sugahara | ............... H10B 10/12 |

FOREIGN PATENT DOCUMENTS

EP    3 496 101 A1    6/2019

OTHER PUBLICATIONS

French Preliminary Search Report issued Jun. 3, 2022 in French Application 21 11286, filed on Oct. 25, 2021 (with English Translation of Categories of cited documents and Written Opinion), 2 pages.
Mathew, S. et al. "A 0.19pJ/b PVT-Variation-Tolerant Hybrid Physically Unclonable Function Circuit for 100% Stable Secure Key Generation in 22nm CMOS" ISSCC 2014 / Session 16 / SoC Building Blocks / 16.2 (3 pages).
Giterman, R. et al. "A 7T Security Oriented SRAM Bitcell" IEEE Transactions on Circuits and Systems—II: Express Briefs, vol. 66, No. 8, Aug. 2019. (5 pages).

* cited by examiner

*Primary Examiner* — Jerome Leboeuf
(74) *Attorney, Agent, or Firm* — Oblon, McClelland, Maier & Neustadt, L.L.P.

(57) ABSTRACT

A static random access memory device includes a memory matrix provided with at least one set of SRAM memory cells and a circuit for initializing cells of the set, the setting circuit being able to carry out various setting types and in particular a "deterministic" setting in which the cells are established at an imposed value and to carry out a "free" setting in which the cells are established at a value that depends on their manufacturing method.

17 Claims, 6 Drawing Sheets

SRAM WITH RECONFIGURABLE SETTING

TECHNICAL FIELD

The present invention relates to the field of memories, and in particular of the SRAM (SRAM for Static Random Access Memory) type, and relates more precisely to that of the setting of SRAM memories, in particular when this setting is used as a countermeasure to prevent fraudulent access.

The present invention implements an improved setting circuit allowing to carry out various setting types.

PRIOR ART

The function of an SRAM memory is the storage of volatile information, some of which, for example such as encryption keys, can be confidential and/or need to be secured. There is a reduced number of techniques for setting of an SRAM memory.

The most well-known setting technique is a "free" setting, which consists of the turning on without constraints of a plane of memory cells. With a free setting, the state in which each cell is set is established freely. In particular, during a turning on without constraints of a k-th chip out of a very large number $N_p$ 10,000 of chips produced, the cell of the i-th column and of the j-th row has a probability $p_{ijk}$ of being set to a '1' logic level and a probability $1-p_{ijk}$ of being set to a '0' logic level. Over a large number 100 of settings without constraints, the average of the setting values of the cell of the i-th column and of the j-th row in a memory plane of the k-th chip tends towards this probability value $p_{ijk}$. It turns out that this probability value changes from one cell to another and between one chip and another, in such a way that over a set of the cells of different chips, there will be a statistic of p that depends in particular on the local variability of its manufacturing method and more globally on PVT (Process, Voltage, Temperature) conditions in other words on the local and global variations of the manufacturing method, on the slew rate $V_{SR}$ (expressed in volts/second) of the level of power supply voltage used, and on the operating temperature.

With such a setting technique, the setting state of the memory or of certain cells of the memory is thus capable of forming a digital fingerprint or signature. For a set k, it is in particular the cells with a high probability of switching and of initialising to a given logic level ($p_{ijk}$ equal or very close to 1 for the cells with a strong tendency to set to '1'; and $p_{ijk}$ equal or very close to 0 for the cells with a strong tendency to set to '0') that can be used to form this digital signature of the k-th chip.

The setting of a memory that is in operation requires, however, a preliminary erasing step. It can consist of, first, cutting off the power supply of the memory in particular either by grounding it or by placing it at a negative voltage until its contents are entirely erased, then, once again powering the memory.

FIG. 1A thus illustrates an erasing technique capable of being implemented to carry out a free setting. A memory circuit 10 formed of SRAM cells and which is powered by a power supply voltage VDD is set to a reference potential GND, by switching of a switch element 12.

One disadvantage of the free setting is that in case of a malicious intrusion after such a setting, a third-party device can optionally recover this digital fingerprint or signature.

Another erasing technique capable of being used to set a memory is illustrated in FIG. 1B and involves connecting the internal nodes NT, NF of an SRAM cell after having previously disconnected its power supply source. This technique requires here the addition of a transistor $T_1$ at the memory cell that allows alternatingly to connect together or disconnect from one another the internal nodes NT, NF according to the state of a reset signal $\overline{RESET}$. The implementation of this type of erasing requires a modification of the structure of the cells which is furthermore to the detriment of the integration density.

A "deterministic" setting technique involves writing, address after address, a predetermined content which can have been previously set by the user or the designer of the memory. In the exemplary embodiment illustrated in FIG. 1C, a circuit 20 for controlling writing operations can be configured to carry out a deterministic setting, in which the state of each memory cell is forced to a determined value, for example by writing only '0' values or only '1' values in each memory cell. The implementation of this type of setting is carried out here to the detriment of the time spent rewriting a certain number of memory points at various addresses, to the detriment of the associated consumption as well as with the risk of a leak of information related to this rewriting or carried out maliciously during this long operation.

A single notation can be used for the two setting types, if it is considered that each cell sets during the turning on, thus during a rising ramp of the power supply voltage VDD. The value $p_{ijk}$ does not therefore depend on the final value of the power supply voltage, but rather on the speed of this rise in voltage, which can be indicated through the slew rate $V_{SR}$ (expressed in volts/second). Finally, the statistic depends, if the access transistors of the lines are on, also on the difference in potential $\Delta V=V(BLTi)-V(BLFi)$ which is imposed by the outside. A law of distribution of the setting values of the cells can thus be in general indicated as $p(P, V_{SR}, \Delta V, T)$, while continuing to indicate with $p_{ijk}$ the setting probability of the cell of the i-th column and of the j-th row of the k-th chip produced.

The present application aims to find a new type of circuit for setting the data contained in an SRAM which is improved with respect to the disadvantages mentioned above.

DISCLOSURE OF THE INVENTION

According to one aspect, the present invention relates to a static random access memory device comprising a memory matrix provided with at least one set of SRAM memory cells, each of said cells of said set comprising:
  a first storage node and a second storage node,
  a first inverter and a second inverter cross-connected between said first node and said second node, the first inverter and/or the second inverter being connected to a "high" power supply line that can be set to a power supply potential and to a "low" power supply line that can be set to a reference potential,
  a first transistor for access to the first storage node and a second transistor for access to the second storage node, the first access transistor and the second access transistor being respectively connected to a first bit line and to a second bit line, the first bit line and the second bit line being shared by said cells of said column, an activation or a deactivation of the access transistors being controlled by a word line,
  the device being further provided with a circuit for initialising cells of said set configured to, according to a first setting mode, according to a first "erasing" phase: place the first node and the second node of at least one group of memory cells at potentials equal to one another or substantially equal to one another, then, according to a second phase, bias the first bit line differently than the second bit line while activating the first access transistor and the second access transistor of the cells of said group, the setting circuit being further configured to, according to a second setting mode, according to a first "erasing" phase, place the first node and the second node of at least one groups of cells at equal potentials then after the first phase:

according to a second phase, deactivate the first access transistor and the second access transistor of the cells of said group while placing the high power supply line at the power supply potential in order to power the first inverter and the second inverter.

Thus, the setting circuit allows, during the pre-setting phase, to carry out an erasing of data memorised in the SRAM while equalising the internal nodes of the memory cells then to be able to set its contents either according to a first setting mode or according to a second setting mode.

The first setting mode can be a "deterministic" setting mode in which a logic value is imposed onto each of the cells.

The second setting mode can be a "free" setting mode in which each cell is allowed to switch freely to a logic value with a probability $p_{ijk}$ that follows a statistic $p(P, V_{SR}, 0, t)$ that is a function of the local variations and of the specific operating conditions of this cell and of the chip to which it belongs. A setting circuit as implemented according to the invention thus gives the possibility of combining at least two setting techniques in the same memory circuit.

To allow to make inaccessible the "random" contents of the memory the first setting mode can be a "deterministic" setting mode used for example when a fraudulent access to the memory is detected.

To allow to use the contents of the memory as a digital signature or digital fingerprint in order for example to generate an encryption key or when it is desired to generate a random number, the first setting mode can be used.

According to an advantageous embodiment, during the erasing phase, the first node and the second node are placed at potentials equal or substantially equal to each other, by connecting to each other said first bit line and said second bit line, the setting circuit being further provided: with a switch element, in particular a transistor, configured to alternatingly connect to each other and disconnect from one another the first bit line and the second bit line, said switch element being controlled by a first control signal, so as to disconnect from one another the first bit line and the second bit line during said second phase of the first setting mode and of the second setting mode.

Advantageously, the setting circuit is further provided with another switch element, in particular another transistor, configured to alternatingly decouple the "high" power supply line from a power supply during the setting phase and to couple the "high" power supply line and said power supply during the second phase, the other switch element being controlled by said first control signal.

According to one possible embodiment, the matrix is further arranged into rows of one or more SRAM cells and wherein a plurality of word lines are respectively connected to said plurality of SRAM memory cells of said column, each word line allowing, when it is activated, to select the memory cell(s) of a given row of SRAM cells among said rows of SRAM cells, the setting circuit further comprising a stage for simultaneous activation of said word lines to, during the second phase of said first setting mode, carry out, via a second control signal, maintain a simultaneous activation of said word lines of said group of cells.

The setting circuit can further comprise:
a first bias line capable, when it is coupled to the first bit line, of imposing a first bias potential or a first bias current onto the first bit line,
a first transistor for coupling between the first bias line and the first bit line controlled by a first control signal,
a second bias line capable, when it is coupled to the second bit line, of imposing a second bias potential or a second bias current onto the second bit line,
a second coupling transistor arranged between the second bias line and the second bit line controlled by a second control signal.

Advantageously, the first coupling transistor is provided to alternatingly couple the first bias line to the first bit line or decouple the first bias line from the first bit line, the second coupling transistor being provided to alternatingly couple the second bias line to the second bit line or decouple the second bias line from the second bit line, so that:

during the erasing phase of the first setting mode and of the second setting mode: the first bias line and the second bias line are decoupled respectively from the first bit line and from the second bit line, during the second phase of the first setting mode: the first bias line is coupled to the first bit line while the second bias line is decoupled from the second bit line or the first bias line is decoupled from the first bit line while the second bias line is coupled to the second bit line, during the second phase of the second setting mode, the first bias line is decoupled from the first bit line while the second bias line is decoupled from the second bit line.

According to one possible embodiment, during the second phase of the first setting mode one of said first bit line and second bit line is set to the power supply potential while the other of said first bit line and second bit line is left floating or grounded or set to a potential lower than the reference potential acting as a ground.

Advantageously, the first bias line and the second bias line are set to the power supply potential.

According to one possible embodiment, the first coupling transistor has a size W1/L1 and the second coupling transistor has a size W2/L2 different than that of the first coupling transistor and/or at least one of said first bias potential and second bias potential is provided at a value $\Delta V$ such that: $GND<\Delta V<VDD$ and in particular such that $GND<\Delta V<VDD/10$.

According to one possible embodiment, the setting circuit is provided with a logic control block capable of receiving a first signal for triggering the first setting mode and a signal for triggering the second setting mode and of producing consecutively to the reception of the first triggering signal a first sequence of control signals, placing the setting circuit in the first setting mode, and of producing consecutively to the reception of the second triggering signal a second sequence of said control signals, distinct from the first sequence and placing the setting circuit in the second setting mode.

According to one possible embodiment among said control signals there is:

a first control signal for, when the first control signal is in a first state, controlling a connection of the bit lines to each other and a disconnection between the high power supply line and said power supply and when the first control signal is in a second state controlling a disconnection of the bit lines from one another and a connection of the high power supply line to said power supply and, a second control signal for, when the second control signal is in a first state, controlling a simultaneous activation of the word lines, when the second control signal is in a second state, controlling a simultaneous deactivation of the word lines.

Advantageously, the logic control block can be provided with a first multiplexer and with a second multiplexer, respectively producing the first control signal and the second control signal, a first input of the first multiplexer being connected to a second input of the second multiplexer and receiving an erasing signal, the state of which depends on the first triggering signal and on the second triggering signal, a second input of the first multiplexer being connected to a first input of the second multiplexer, and receiving the erasing signal with a predetermined delay, the second triggering signal forming a selection signal shared by the first multiplexer and the second multiplexer.

Advantageously, a change of state of the second triggering signal is consecutive to a detection of fraudulent access to the memory device.

According to one possible embodiment, a change of state of the first triggering signal is consecutive to an emission of a signal coming from a module configured to generate a digital signature and/or an encryption key and/or a random number.

Advantageously, during the first phase of the first setting mode and of the second setting mode, the "high" power supply line is decoupled from a power supply at the power supply potential VDD, so as to not power the first inverter and the second inverter, and wherein during the second phase of the first mode and of the second setting mode, the "high" power supply line is coupled to a power supply at the power supply voltage VDD, so as to power the first inverter and the second inverter.

The present invention also relates to the use of a device as defined above to generate a digital signature and/or an encryption key and/or a random number.

The present invention also relates to a method for controlling a device as defined above, wherein:

during a first setting step according to the first setting mode, at least one given bias line out of said bias lines is set to a given bias potential $\Delta V1$ between the reference potential and the power supply potential VDD and in particular such that $\Delta V1<VDD/10$, then during a second setting step according to the first setting mode, said given bias line is set to a bias potential $\Delta V2$ different than the given bias potential and between the reference potential and the power supply potential VDD and in particular such that $\Delta V2<VDD/10$.

BRIEF DESCRIPTION OF THE DRAWINGS

The present invention will be better understood upon reading the description of exemplary embodiments given, purely for informational and non-limiting purposes, while referring to the appended drawings in which.

Figure 1A:
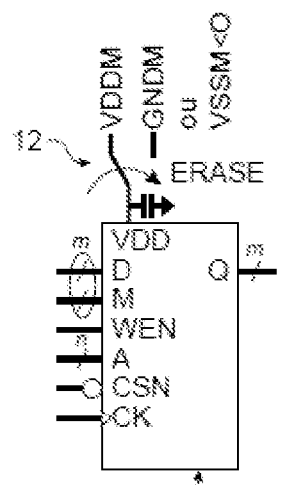
FIGS. 1A, 1B, 1C are used to illustrate various known erasing techniques of an SRAM memory.

Identical, similar or equivalent parts of the various drawings carry the same numerical references so as to facilitate the passage from one drawing to another.

The various parts shown in the drawings are not necessarily shown according to a uniform scale, to make the drawings more readable.

DETAILED DISCLOSURE OF SPECIFIC EMBODIMENTS

A setting circuit as implemented according to the invention is integrated into an SRAM memory device comprising a memory plane $M_1$ formed by at least one column of cells. Typically, this memory plane $M_1$ is, as illustrated in FIG. 3, provided with a plurality of rows and of columns of SRAM cells.

Figure 2:
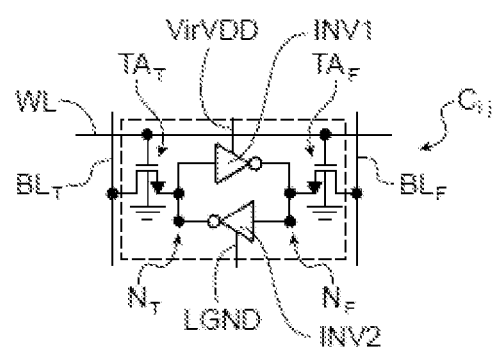
FIG. 2 is used to illustrate an SRAM memory cell capable of being integrated into a memory device according to the invention.

The cells can have a conventional arrangement, which implies that the setting circuit can be implemented without a modification of their internal structure being necessary. In FIG. 2, a conventional SRAM cell $C_{ij}$ is thus shown with its two storage nodes NT and NF, provided to preserve a first piece of logic information, and a piece of logic information complementary to the first piece of information. The retention of the logic information in the nodes is ensured by transistors forming inverters INV1, INV2 looped onto themselves. For example, when the SRAM cell is of the type routinely called "6T" and thus forms 6 transistors, the two inverters INV1, INV2 are typically created by two charge transistors and two conduction transistors. The inverters INV1, INV2 are connected to a first power supply line, in particular a "high" power supply line VirVDD, and to a second power supply line LGND, in particular a "low" power supply line. Outside of phases during which the setting circuit operates and in particular outside of erasing phases implemented by this setting circuit, the high power supply line VirVDD is set to a potential, for example VDD, that is greater than that of the low power supply line LGND. The access to the storage nodes NT and NF is carried out via two access transistors $TA_T$ and $TA_F$ respectively connected to bit lines $BL_T$ and $BL_F$ generally shared by the SRAM cells of the same column of cells of the matrix plane. This access to the storage nodes NT and NF is controlled by a word line WL generally shared by the SRAM cells of the same row of cells of the matrix plane. The access transistors $TA_T$ and $TA_F$ are thus provided to allow, when they are activated to allow the access to the first node NT and to the second node NF, or when they are deactivated to block the access to the first node NT and to the second node NF.

Figure 3:
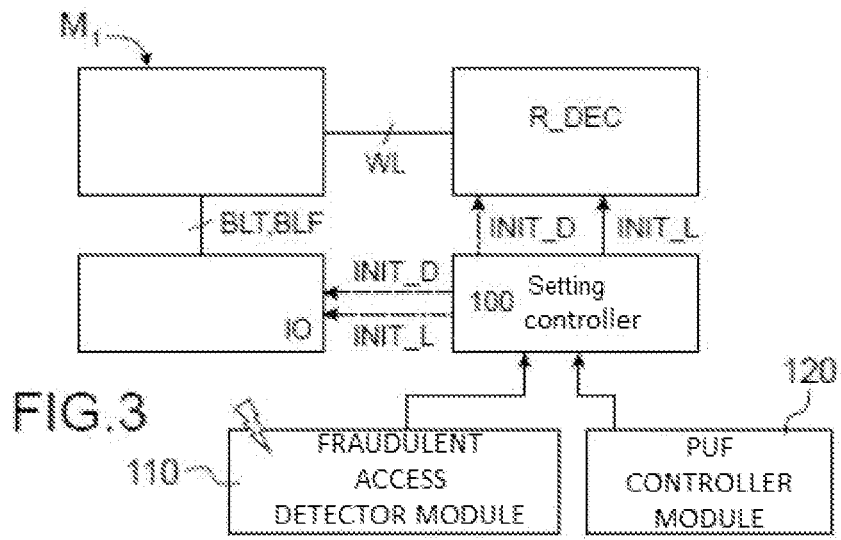
FIG. 3 is used to illustrate a circuit for initialising an SRAM memory as implemented according to an embodiment of the present invention and which is configured to carry out a setting of memory cells according to at least two different setting types and in particular a deterministic setting and a free setting.

To allow to carry out a setting of a group of cells or of all the cells of the memory, as illustrated in FIG. 3, a setting circuit 100 disposed at the periphery of the matrix plane $M_1$ is provided. The setting circuit 100 only requires here the implementation of a limited number of additional elements peripheral to the memory plane $M_1$. The setting circuit 100 has the particularity of being able to adopt various operating modes corresponding to various ways of initialising a group of memory cells or all of the cells of the memory plane $M_1$.

A first operating mode allows to carry out a deterministic setting INIT_D. For this a writing of at least one group of cells of the memory is carried out by imposing onto each cell of this group a predetermined value '1' or '0'. A predetermined set of predetermined values is thus imposed onto the group of cells that is being set or reset.

A particular manner of initialising according to the deterministic setting mode is to impose the same state for example '1' or '0' onto all the cells of the group of set cells. By taking as convention that the value of the node NT of a cell is equal to the value memorised by this cell, this is the same here as writing a value '1' or '0' onto the respective first nodes NT of the group of cells set.

The deterministic setting to a value imposed onto each cell is thus typically carried out simultaneously among the cells of a group of set cells. Means for simultaneous activation of the word lines to carry out a simultaneous activation of the word lines WL so as to carry out a simultaneous selection of rows of SRAM cells are thus provided in this case.

The predetermined value at which each set cell is placed can be set by the user of the memory or by the designer of the memory.

According to a specific embodiment illustrated in FIG. 3, the setting circuit 100 is configured to carry out a deterministic setting as a self-protection mechanism for example to prevent a malicious manipulation of the memory. A third-party device can thus be prevented from accessing or deteriorating information of the memory device, and in particular data for identification or for authentication of the memory relative to the PUF (Physically Unclonable Function) used as a digital signature or digital fingerprint of the memory. This digital fingerprint which can for example be used to form an encryption key is thus prevented from being obtained by the third-party device responsible for the malicious manipulation.

Thus, a module 110 for detecting fraudulent access can be provided to transmit to the setting circuit 100 a signal of detection of fraudulent access $S_{AF}$ allowing to trigger its passage into an operating mode of deterministic setting. Such a module can be provided with functions similar to those of a TAMP module present in an STM32GO microcontroller marketed by the company STMicroelectronics and described in the instructions "STM32GO-TAMP, tamper and back-up registers, revision 1.0".

As for a PUF controller module 120, it can be provided to transmit to the setting circuit 100 a signal $S_{PUF}$ allowing to trigger its passage into another setting mode called "free", for example when it is desired to obtain an encryption key from values stored in the memory when it is set by free setting. Like the detection module 110, the PUF controller module 120 can be in the form of a dedicated digital circuit or in the form of a digital function carried out by a processor.

Thus, when it is desired to use the memory plane or a group of memory cells of this plane once set or reset, to generate a digital fingerprint or a digital signature, the set circuit 100 is placed in the free setting operating mode. Each set cell is thus set to a value that depends on its local manufacturing method and on the PVT (Process, Voltage, Temperature) conditions, in other words of overall manufacturing method, of voltage used level, and of operating temperature.

Figure 4:
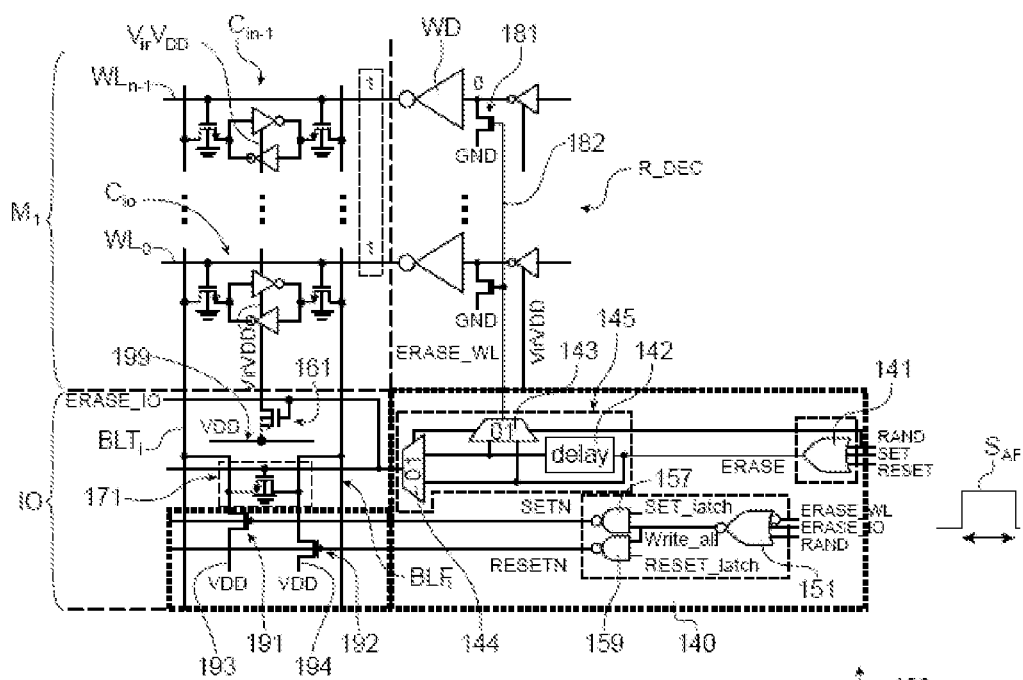
FIG. 4 is used to illustrate a circuit for initialising an SRAM memory as implemented according to a specific embodiment of the present invention and in which the setting of cells can be carried out according to a deterministic setting mode and according to a free setting mode.

A specific example of implementation of a setting circuit 100 capable, alternatingly, of carrying out a deterministic setting and a free setting is illustrated in FIG. 4 and will be described in relation to FIGS. 5A, 5B.

Figure 5A:
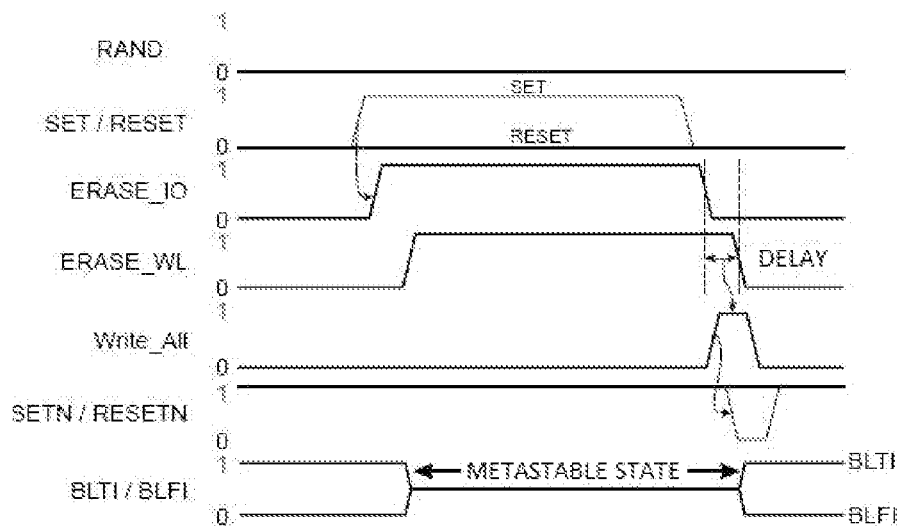
FIGS. 5A, 5B are used to respectively illustrate, via chronograms, a phase of deterministic setting and a phase of free setting that the same setting circuit according to an embodiment of the invention is capable of implementing.
Figure 5B:
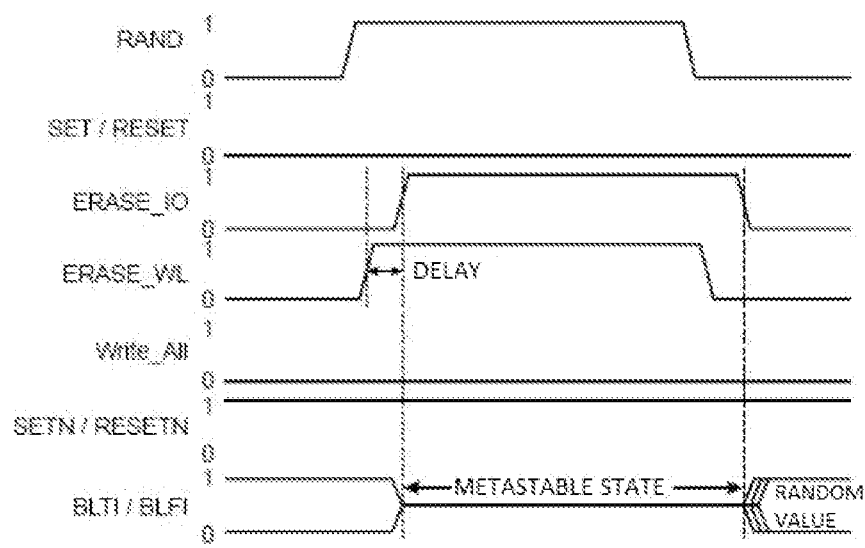

The chronograms of FIGS. 5A, 5B are respectively representative of a sequence of signals implemented by the setting circuit 100 to carry out a deterministic setting and of another sequence of signals this time implemented by the same setting circuit 100 to carry out a free setting.

In order to not overload FIG. 4, only one column of cells $C_{in-1}, \ldots C_{i0}$ is shown but the matrix plane $M_1$ can include several columns of SRAM memory cells.

The setting circuit 100 located at the periphery of the matrix plane $M_1$ is provided here with an asynchronous logic control block 140 receiving as an input the asynchronous logic signals RESET, RAND, SET, respectively for deterministic setting to zero, for triggering free setting, and for triggering deterministic setting to one.

A change of state of the signal SET for triggering deterministic setting can be caused for example consecutively to a detection of a fraudulent attempt to access the memory, and this detection itself can translate into the emission or the change of state of a signal of detection of fraudulent access $S_{AF}$.

In the example of FIG. 5A, the signal SET goes in particular into a logic state '1', which triggers first of all an erasing phase. The change of state of the signal SET causes a change of state of an "erasing" signal ERASE on which a sequence of control signals ERASE_IO, ERASE_WL depends.

The erasing signal ERASE is produced at the output of a stage 141 of the control block 140 receiving as an input the signal SET for triggering deterministic setting, the signal RAND for triggering free setting, the signal RESET, and carrying out an OR function among these signals. The stage 141 is in the specific exemplary embodiment illustrated formed by a logic gate, in particular carrying out an OR function.

During the erasing, the high power supply line VirVDD of the memory cells to be set can be disconnected (left floating) or grounded. It is in any case decoupled from an element of the gate type or power supply line set to the power supply potential VDD. At least one of the inverters and advantageously both inverters are not then powered.

For this, the setting circuit is advantageously provided with a switch element controlled by a first control signal ERASE_IO and configured to, consecutively to a change of state of this first control signal ERASE_IO, allow to disconnect said high power supply line VirVDD from the power supply network carrying a power supply potential VDD. In the example illustrated, the switch element is in the form of a transistor 161, here of the PMOS type, receiving on its gate the first control signal ERASE_IO and disposed between the power supply network set to a potential VDD and the high power supply line VirVDD.

An erasing phase of a deterministic setting is triggered here by a signal SET or RESET rising to a '1' logic level. The signals SET_latch, RESET_latch can be latch output signals of inputs respectively receiving the signals SET and RESET, the logic signal RESET_latch being complementary to the logic signal SET_latch. During this erasing phase of a deterministic setting (signals of FIG. 5A), the first control signal ERASE_IO follows the same evolution as the erasing signal ERASE. The first control signal ERASE_IO can be in particular produced at the output of a first multiplexer 144 with two inputs '0' and '1' and the selection signal of which is the signal RAND for triggering free setting, in this operating mode deactivated and thus maintained in a '0' logic state. The first multiplexer 144 receives on its first input (input '0') the erasing signal ERASE and on its second input (input '1') an output signal of a delay stage 142, this output signal corresponding to the erasing signal ERASE with a predetermined delay. During the erasing phase, the internal nodes NF, NT of the memory cells that it is desired to set are equalised: they are set to equal or substantially equal potentials (i.e. to values that differ by less than 10 mV). Such an erasing phase allows to implement several setting modes while limiting the number of components necessary for this implementation and while limiting the duration necessary to carry out each setting.

In the specific exemplary embodiment illustrated in FIG. 4, the equalising of the nodes NF, NT of the cells of the i-th column is carried out by connecting together the bit lines BLTi and BLFi and by coupling these bit lines BLTi and BLFi to these nodes NF, NT through the access transistors $TA_T$ and $TA_F$.

For this, another switch element formed for example by an N-type transistor 171, the gate electrode of which is controlled by the first control signal ERASE_IO, can be provided between the bit lines BLTi and BLFi. Thus, according to the state of the first control signal ERASE_IO, it is possible to alternatingly connect together the bit lines BLTi and BLFi when it is desired to carry out an erasing, or disconnect the bit lines BLTi and BLFi from one another to allow the establishment of the nodes NF, NT at respective values different from one another.

When the bit lines BLTi and BLFi are connected to each other (first control signal ERASE_IO at the level '1' in FIG. 5A), these bit lines BLTi and BLFi can also be isolated from bias lines 193, 194 set for example to the potential VDD of an IO circuit peripheral to the memory plane and located at an end of the column of cells, generally at the column foot. A switch element is thus provided to alternatingly allow to ensure the coupling or the decoupling between the first bit line BLTi and the first bias line 193. Likewise, a switch element is provided to alternatingly allow to ensure the coupling or the decoupling between the second bit line BLF and the second bias line 194.

In the example illustrated, these switch elements are in the form of coupling transistors 191, 192 for example of the PMOS type. The gates of the transistors 191, 192 are controlled here respectively by a first control signal SETN and another control signal RESETN.

In the exemplary embodiment illustrated, the control signals SETN and RESETN are signals of outputs respectively of a first logic block 157 carrying out a NOT-AND (NAND) logic function and of a second logic block 159 carrying out a NAND function. The first logic block 157 has here an input controlled by the logic signal SET_latch while the second logic block 159 has an input controlled by the logic signal RESET_latch complementary to the first logic signal SET_latch.

The two logic blocks 157, 159 also have a shared input controlled by a signal Write_all for triggering simultaneous writing, itself dependent on a second control signal ERASE_WL, on the first control signal ERASE_IO and on the signal RAND for triggering free setting. In the specific exemplary embodiment illustrated, the signal Write_all for triggering simultaneous writing is produced at the output of a block 151 carrying out a NOT-OR (NOR) function and receiving as an input a signal not(ERASE_WL) complementary to the second control signal ERASE_WL, the first control signal ERASE_IO and the triggering signal RAND.

To allow to carry out a simultaneous selection of several rows of cells of the matrix plane, means or a selection stage integrated into a row decoder R_DEC of the memory plane comprise an additional line 182 provided to carry the second control signal ERASE_WL used as a signal for simultaneous selection of word lines. For each part of the row decoder R_DEC associated with a row of cells of the matrix, a transistor 181, the gate of which is connected to the additional line 182 carrying the control signal ERASE_WL, is provided.

The transistor 181, the gate of which is controlled by the signal ERASE_WL, is connected to the input of an inverter circuit WD located at the output of the row decoder R_DEC. In the exemplary embodiment illustrated, the transistor 181 is of the N-type and the simultaneous selection is carried out here when the second control signal ERASE_WL carried on the additional line 182 is set to a '1' logic level. The second control signal ERASE_WL can be in particular produced at the output of a second multiplexer 143 with two inputs '0' and '1' and the selection signal of which is the signal RAND for triggering free setting. The second multiplexer 143 receives on its first input (input '0') the output signal of the delay stage 142, this output signal corresponding to the erasing signal ERASE with a predetermined delay. The multiplexers 144, 143 are thus controlled by the same selection signal and have inputs inverted with respect to one another, so that the first input of the first multiplexer is connected to the second input of the second multiplexer while the second input of the first multiplexer is connected to the first input of the second multiplexer. With such a configuration of the multiplexers 144, 143 and the delay stage 142, a block 145 can thus be produced which, according to the triggering signal RAND, produces different sequences of control signals ERASE_IO for equalising the bit lines and for the coupling/decoupling of the power supply line, and ERASE_WL for control of simultaneous selection according to whether one setting mode or the other is being used.

A new change of state of the signal SET (in the example of FIG. 5A passage once again to the logic state '0') for triggering deterministic setting terminates the erasing phase and causes a change of state of the first control signal ERASE_IO, so as to decouple from each other the first node NT and the second node NF by disconnecting here the first bit line BLTi from the second bit line BLFi. The change of state of the first control signal ERASE_IO also allows to re-establish the power supply of the cells by once again connecting, via the transistor 161 turned on, the high power supply line virVDD to the power supply gate set to the power supply potential VDD.

In the example illustrated in FIGS. 4 and 5A, the passage to the state '0' of the first control signal ERASE_IO also triggers a passage to the state '1' of the simultaneous writing signal Write_All. This passage to the state '1' of the simultaneous writing signal Write_All causes a change of state of the control signal SETN, here activated or set to a '0' logic state, so as to couple the first bit line BLTi to the bias line 193 at the power supply potential VDD. As for the second bit line BLFi, it remains decoupled from the bias line 194 insofar as the other control signal RESETN is maintained in the same '1' logic state.

As long as the second control signal ERASE_WL is maintained in the state '1', which allows to maintain the access transistors activated, by creating an imbalance in bias between the first bit line and the second bit line, the simultaneous writing of a piece of data, here a value '1' in the nodes NT and all the cells, the word line of which has been activated, is thus forced. The duration of the simultaneous writing depends and can be in particular equal to the predetermined delay imposed by the stage 142. Upon return of the signal Write_All to the state '0', the phase is concluded, and the operation just carried out (SET or RESET) remains memorised in the signals SET_LATCH and RESET_LATCH.

In the deterministic setting mode, the probability that a memory cell sets to 1 is equal to 1 if a SET is carried out: $p(P, V_{SR}, VDD, T)$ of FIG. 7B thus has a single peak at the value '1'. The probability that a cell sets to 0 is equal to 1 is a RESET is carried out: $p(P, V_{SR}, -VDD, T)$ thus has a single peak at the value '0'.

The erasing phase of a free setting is triggered by a signal RAND rising to a '1' logic level, an example illustrated in FIG. 5B. The change of state of the triggering signal RAND also triggers first of all here an erasing phase. A change of state of the erasing signal ERASE at the output of the stage 141 itself causes a change of state of the second control signal ERASE_WL allowing a simultaneous selection of the word lines.

The first control signal ERASE_IO is this time delayed with respect to the second control signal ERASE_WL by the predetermined delay imposed by the delay stage 142. A change of state of the first control signal ERASE_IO following that of the second control signal ERASE_WL leads to a disconnection of the high power supply line virVDD of the cells and an equalising ("METASTABLE STATE" of signals BLTi, BLFi respectively of bit lines of an i-th column in FIG. 5B) of the potential values of the first node NT and of the second node NF, here again via a connection to each other of the bit lines BLTi and BLFi while the access transistors are activated. During the equalising of the nodes NF, NT by connection of the bit lines BLTi and BLFi, the latter are isolated from additional bias lines 193,194. The control signals SETN and RESETN are by the way maintained deactivated here (i.e. at '1') so as to decouple the bit lines BLTi and BLFi from the additional bias lines 192, 193 during the entire duration of the free setting operating mode. During the erasing phase, the high power supply line virVDD is decoupled from an element 199 such as a power supply gate or a power supply line at the power supply potential VDD. This decoupling is carried out here via a transistor 161 turned off. The first inverter INV1 and the second inverter INV2 are not then powered.

A new change of state of the triggering signal RAND (in the example of FIG. 5B passage once again to the logic state '0') causes a change of state of the second control signal ERASE_WL, which causes the end of the simultaneous selection of the word lines, then a change of state of the first control signal ERASE_IO. This change of state, here the setting to '0' of the first control signal ERASE_IO, leads to the end of the phase of pre-setting and of equalising of the nodes. This triggers a disconnection of the bit lines BLTi and BLFi from one another. This change of state of the first control signal ERASE_IO also causes a reconnection of the high power supply line VirVDD of the cells to a power supply gate. The high power supply line VirVDD is thus re-established at a power supply potential VDD. The first inverter INV1 and the second inverter INV2 are then powered.

The cells are thus once again powered and their access transistors are thus typically deactivated. Each cell can thus individually switch to a value '1' or '0' (corresponding for example by convention to a '1' or '0' logic state of their first node NT) in a free or random manner, but which follows the statistic $p(P, V_{SR}, 0, T)$ that is a function of the specific local variations and conditions of operations of this cell and of the chip to which it belongs. Thus, some cells are therefore set to a '1' logic state while others are set to a '0' logic state.

The exemplary embodiment that has just been given and in which the equalising of the nodes is carried out by connection of the bit lines to each other during the erasing phase allows to carry out a faster and less consuming setting than a simple grounding of the storage nodes.

In the exemplary embodiment that has just been described, after the complete erasing of a group of cells or of a memory the SRAM by equalising the internal nodes to an identical value during the erasing phase, its new contents are configured in a free or deterministic manner. The setting circuit allows to alternatingly use one or the other of these two techniques while limiting the number of components necessary and the consumption caused by the setting.

Besides allowing to carry out various setting types, the setting circuit also allows to accelerate the deterministic writing of all or of a subset of the memory to a value set by the user or the designer of the memory, via the presence and the method for controlling the transistors connected to the power supply networks 191 and 192.

However, alternatively to or in combination with the exemplary embodiment described above, the erasing phase during which the first node NT and the second node NF of each cell are equalised can be carried out by forcing the bit lines to ground.

Figure 1B:
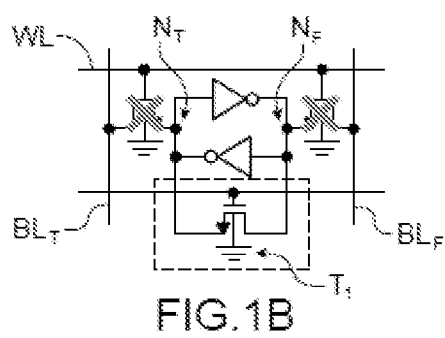
Figure 1C:
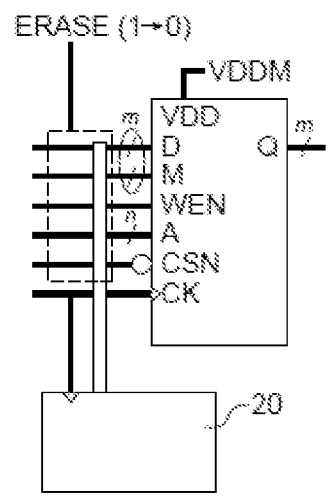

Alternatively, it is possible to use non-conventional memory cells 6T, which include, as shown in FIG. 1B, an erasing transistor $T_1$ even though this is less advantageous in terms of compactness and integration density. In this case, the erasing no longer requires having the transistor 171 at the column foot. The control logic can thus be adapted to control the conduction of the erasing transistors in each cell via a signal for controlling these erasing transistors which can be similar to that of the signal ERASE_IO. The activation of the signal ERASE_WL is thus no longer necessary in this erasing phase and it is optionally possible to eliminate the presence of this signal ERASE_IO with the associated transistors 181. The possible interest of preserving the latter lies in the implementation of the setting to be able to cause a deterministic or free setting on a plurality of rows of memory cells simultaneous. Likewise, in the example that has just been given, to allow the deterministic setting, during the second phase after the erasing, a potential equal to VDD is applied onto one of the bit lines while the other bit line remains floating. Alternatively, another manner of biasing the bit lines or another bias difference between the bit lines are possible.

According to a first option, NMOS transistors connected to ground lines can be used in place of PMOS transistors connected to power supply lines 193 and 194 set to VDD.

According to a second option, an "analogue" adjustment of the current or of the voltage to be imposed on one or the other of the bit lines during the second setting phase is carried out, in particular by applying a current or a voltage onto the bit line intermediate with respect to that applied when the bit line is coupled to the ground or to the power supply potential VDD, in order to obtain a random selection associated with a probability different than a "standard" probability defined when a power supply potential VDD or the ground GND is applied. A specific embodiment of this second option will be described below in relation to FIG. 6.

In the exemplary embodiment described above in relation to FIGS. 4, 5A, 5B, to carry out the erasing, by equalising the nodes by coupling of the bit lines to each other, a simultaneous selection of the cells is carried out by activating at least several word lines and consequently the access transistors of at least several rows of cells. Alternatively, in particular when the equalising of the nodes is carried out by connection of the nodes to each other, it is possible to keep deactivated the word lines of the rows of cells that it is desired to set. The access transistors of the cells belonging to these rows are thus maintained deactivated to block the access to the cell and decouple the latter from the bit lines.

It is possible to carry out an intermediate setting mode distinct from the free setting mode and the deterministic setting mode described above.

Such a "partly deterministic" setting mode also called "biased" can be used in order for example to accelerate a phase of enrolment of strongly biased memory cells, that is to say which, when they are set, preferably set according to a '1' or '0' value in temperature and voltage conditions varying in a given range.

Figure 7A:
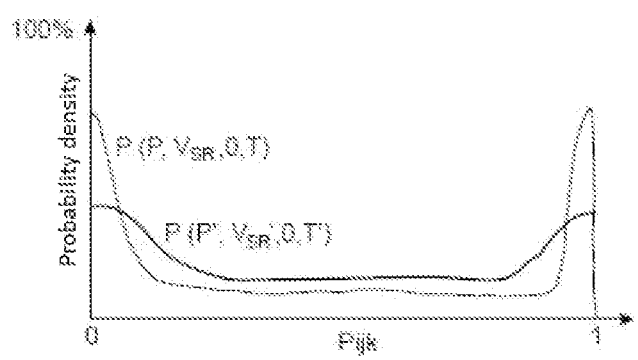
FIGS. 7A, 7B are used to illustrate the statistics of the setting probability of cells according to "free" or "deterministic" modes capable of being implemented by a setting circuit according to the invention.
Figure 7B:
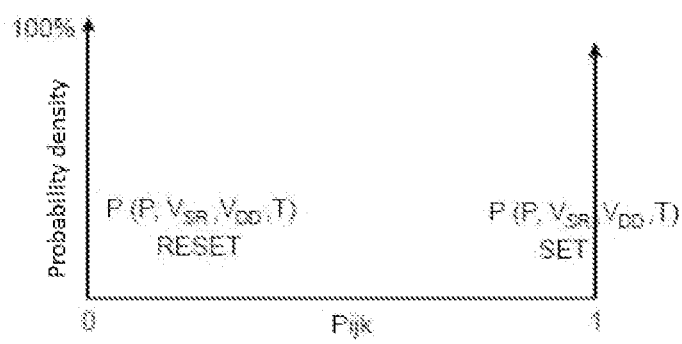

If it is now considered how the statistic p(P, $V_{SR}$, $\Delta V$, T) depends on the voltage applied between the bit lines BLTi, BLFi, in FIGS. 7A-7B only statistics for $\Delta V=-VDD$ (deterministic setting RESET, left-hand peak in FIG. 7B), $\Delta V=0$ (free setting, double peak in FIG. 7A) and $\Delta V=VDD$ (deterministic setting SET, right-hand peak in FIG. 7B) are visible. Such a "biased" setting mode allows to carry out a setting that has an intermediate statistic between these extreme cases, and thus to alter the free setting by favouring the state '0' if $\Delta V<0$ or rather the state '1' if $\Delta V>0$. The voltage values applied onto the bit lines BLTi, BLFi thus allow to control the setting statistic.

This "partly biased" setting mode can be implemented by introducing an imbalance in conductivity between the transistors arranged between the bit line of a bias line. This imbalance, adjustable according to the bias that it is desired to introduce, can be adjusted by adapting the respective dimensioning of the transistors, and in particular their W/L ratio (ratio of the width to the length of the channel) either by adapting their respective biases, or by a combination of these two types of adaptations.

Figure 6:
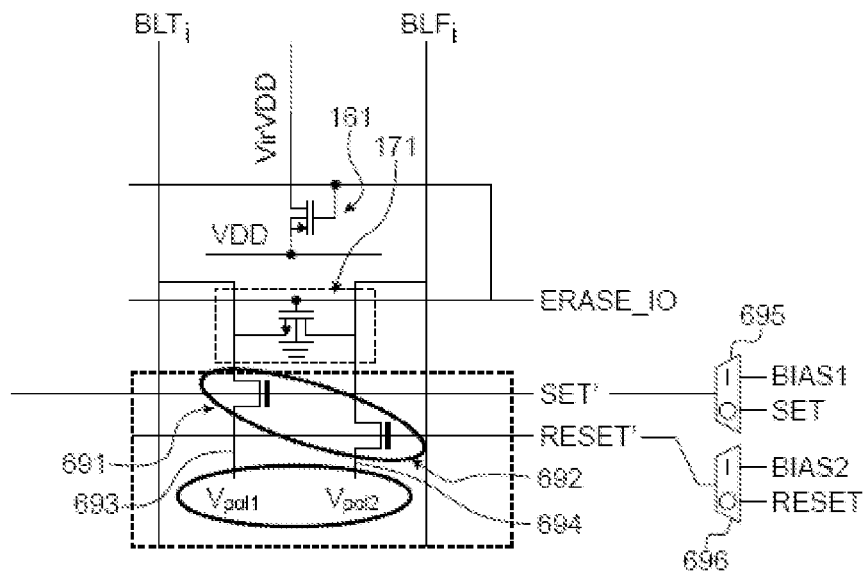
FIG. 6 is used to illustrate an alternative of a setting circuit capable of implementing another setting mode called "biased".

Thus, in FIG. 6, an alternative embodiment allowing to further implement a "biased" setting is illustrated. The probability that a cell sets to "0" or "1" can be in this exemplary embodiment modulated according to the respective values of signals SET', RESET', vpol1, vpol2 applied onto coupling transistors 691, 692 connected to the bit lines BLTi, BLFi.

Between the first bit line BLTi and a first bias line 693 set to a first bias potential Vpol1, a coupling transistor 691 is provided, this transistor 691 being this time of the NMOS type and provided with a gate controlled by the signal SET'. This signal SET' can take on the value of the signal SET when it is desired to carry out a deterministic or free setting. This signal SET' can, however, take on the value of a bias signal BIAS1 when it is desired to carry out a biased setting. To be able to alternatively apply the signal SET or BIAS1 onto the gate of the coupling transistor 691 it is possible for example to provide a multiplexer 695, the inputs of which are the signals SET and BIAS1 and which delivers at the output the signal SET'.

Likewise, a coupling transistor 692, here also of the NMOS type, and provided with a gate controlled by the signal RESET', is provided between the second bit line BLF and a second bias line 694 set to a second bias potential Vpol2. This signal RESET' can take on the value of the signal RESET when it is desired to carry out a deterministic or free setting. This signal can take on the value of another bias signal BIAS2 when it is desired to carry out a biased setting. To be able to alternatingly apply the signal RESET or BIAS2 onto the gate of the coupling transistor 692, it is possible for example to provide a multiplexer 696, the inputs of which are the signals RESET and BIAS2 and which delivers at the output the signal RESET'.

To be able to switch between the various deterministic, free or biased setting modes, it is possible to provide as a replacement of the stage 141 described above a logic circuit (not shown), receiving as inputs the signals RAND, SET, RESET, and an additional binary signal JOK. Thus, a change of state of the additional binary signal JOK determines a triggering of biased setting.

Advantageously, the first transistor 691 can be provided with a ratio W1/L1 different than that W2/L2 of the second transistor 692. Whereas in the exampled described above in relation to FIG. 4 transistors having a significant size are typically chosen, here transistors 691, 692 having a small size can be provided.

Advantageously these potentials Vpol1, Vpol2 are provided equal to $\Delta V$, with $\Delta V \ll VDD$, VDD being the power supply potential VDD. $\Delta V \ll VDD$ ($\Delta V$ much lower than VDD) means that $\Delta V$ is at least less than VDD/10 and advantageously less than VDD/Y.

With the arrangement given in FIG. 6, a biased setting mode can be implemented in which in a first phase, an operation of erasing according to a technique mentioned above can be carried out.

According to a second phase, like for a deterministic setting, a different bias between the first bit line BLTi and the second bit line BLFi is ensured while activating the first access transistor and the second access transistor of the cells set. One of the two bias signals BIAS1, BIAS2 is set to VDD while the other of the two bias signals SET'=BIAS1, RESET'=BIAS2 is at VDD-$\Delta V$. Advantageously, during the second phase, the signals SET'=BIAS1 and RESET'=BIAS2 can be provided so that there is only one of the two transistors 691, 692 that is made conductive. This transistor 691 or 692 made conductive is in an under the threshold or linear or saturated mode. However, the level of voltage or current imposed on the bit line coupled to the transistor made conductive is different than that allowing to impose a given state with a level of probability close to '1' so that the level at which the set cells will be established remains random.

The difference in bias between the bit lines is this time carried out by maintaining the difference in bias between the two bit lines at a low level $\Delta V$ much lower than the power supply potential VDD in order to bias the tendency of the nodes NT and NF to switch to a logic value or a given state without imposing it. The value of $\Delta V$ can be modulated according to the bias that it is desired to introduce. By modifying this value, the probability that a cell has of being established at a level '1' or '0' is modified.

With a device as illustrated in FIG. 6, a succession of setting tests with different values of the bias potentials Vpol1, Vpol2 can be carried out. The potential $\Delta V$ can thus be modulated from one setting to another. This can be useful to allow to verify the probability that a cell has of switching to a '1' or '0' logic state when the setting is not deterministic.

Thus, during a first setting at least one given bias line out of the bias lines 691, 693 is set to a given bias potential $\Delta V=\Delta V_1$, with $\Delta V_1<VDD/10$, then during a second setting step said given bias line 691, 693 is set to a bias potential $\Delta V=\Delta V_2$, $\Delta V_1 \neq \Delta V_2$ and such that $\Delta V_2<VDD/10$.

The complete sequence of the values $\Delta V_i$ can be determined by an algorithm, so as to select the cells more strongly biased. A detection of strongly biased cells can thus be implemented.

Indeed, according to the level of voltage and of bias current applied onto the bit line(s) during the setting, the imbalance introduced between the nodes NT and NF of a cell is different. Between a case in which the two bit lines are both biased to Vdd with a similar current capacity leading to a null initial imbalance between the two nodes, and an opposite case in which the bit lines are biased with a possible dissymmetry in voltage and in current, there is a range of possible imbalances in voltage or in current.

In the case for example in which several tests each consisting of an erasing/free setting/reading cycle are carried out, by using a biased setting, it is possible to seek to identify certain cells which do not switch in the same manner as the majority or very large majority of the others. It can be said of these other "resistant" cells that they intrinsically have a setting bias $p_{ijk}$ such that, when a symmetrical free setting is used, it is very highly probable that they almost always take on the same value. In other words, such "resistant" cells have a probability $p_{ijk}$ close to 1 or to 0 (according to the direction of the dissymmetry applied onto the bit lines) of taking on a given value, for example the value 1, during a symmetrical free setting.

When the probability $p_{ijk}$ that a given cell sets to a value '1' is very close to 0 or 1, it can be advantageously used to establish a digital signature. Thus, if the cells retained to create this digital signature almost always set to the same value, with a very high probability, statistically the digital code obtained by reading these cells after setting will almost always be the same.

According to an alternative use of the memory, it is possible to seek the memory cells having a probability of 0.5 or another value that can be different from the extreme values close to 0 or 1. To do this, tests of the memory cells are carried out with free setting with a null or given dissymmetry in the biases. It is thus possible to list for each cell what its probability $p_{ijk}$ of taking on a given value, for example '1', is for each level of dissymmetry according to the bias.

When the probability $p_{ijk}$ that a given cell sets to a value '1' is centred on 0.5, it can be advantageously used to generate, during a free setting, a random binary number with maximum entropy, thus having an equal probability of 0.5 of returning the value 1 or 0. Alternatively, if it is desired to generate a random number with a probability other than 0.5 and asymmetric between the two values 1 and 0, and thus with non-maximum entropy, a free setting with introduction of a bias allowing to have the desired probability can be implemented.

With such an implementation, a significant gain in time of testing of the cells is obtained. It allows to greatly reduce the number of cycles of turning on the memory/reading/erasing, to allow to identify memory cells that are strongly unbalanced and the setting probability of which is close to 0 or 1, or very well balanced and the setting probability of which is close to ½, or having another value of setting probability.

An implementation as described above in relation to FIG. 6 is particularly favourable to the implementation in the same circuit, in a memory, in a random number generator and in an in-memory computing module (IMC) in particular allowing to carry out a certain function such as a MAC (multiply-and-accumulate) function.

Finally, the activation of several cells of the same column can be combined so as to more easily reach target probabilities. For example, 2 memory cells with probabilities of 0.1 each would have a combined probability with a value much lower than 0.1.

A device as implemented according to one or the other of the embodiments described above can have uses in particular in onboard systems, in systems for HPC (high-performance computing) and/or encryption such as the AES (Advanced Encryption Standard) systems of cryptocurrency systems.

The invention claimed is:

1. A static random access memory device comprising a memory matrix provided with at least one set of SRAM memory cells, each of said cells of said set comprising:
   a first storage node and a second storage node,
   a first inverter and a second inverter cross-connected between said first node and said second node, the first inverter and/or the second inverter being connected to a high power supply line that can be set to a power supply potential (VDD) and to a low power supply line that can be set to a reference potential (GND), and
   a first transistor for access to the first storage node and a second transistor for access to the second storage node, the first access transistor and the second access transistor being respectively connected to a first bit line and to a second line, the first bit line and the second bit line being shared by said cells of said column, an activation or a deactivation of the access transistors being controlled by a word line,
   the device being further provided with a circuit for initialising cells of said set configured to, according to a first setting mode,
   (a) according to a first erasing phase, place the first node and the second node of at least one group of memory cells at potentials equal to one another or substantially equal to one another, then,
   (b) according to a second phase, bias the first bit line differently than the second bit line while activating the first access transistor and the second access transistor of the cells of said group, and
   the circuit being further configured to, according to a second setting mode,
   (c) according to a third erasing phase, place the first node and the second node of at least one group of cells at equal potentials, then
   (d) after the third erasing phase, according to a fourth phase, deactivate the first access transistor and the second access transistor of the cells of said group while placing the high power supply line at the power supply potential in order to power the first inverter and the second inverter.

2. The static random access memory device according to claim 1, wherein during the erasing phase, the first node and the second node are placed at potentials equal or substantially equal to one another, by connecting to each other said first bit line and said second bit line, the setting circuit being further provided: with a switch element, in particular a transistor, configured to alternately connect to each other and disconnect from one another the first bit line and the second bit line, said switch element being controlled by a first control signal, so as to disconnect from one another the first bit line and the second bit line during said second phase of the first setting mode and the fourth phase of the second setting mode.

3. The static random access memory device according to claim 2, wherein the setting circuit is further provided with another switch element, in particular another transistor, configured to alternatingly decouple the high power supply line from a power supply during the first erasing phase of the first setting mode or the third erasing phase of the second setting mode and to couple the high power supply line and said power supply during the second phase of the first setting mode or the fourth phase of the second setting mode, the other switch element being controlled by said first control signal.

4. The static random access memory device according to claim 2, wherein the matrix is further arranged into rows of one or more SRAM cells and wherein a plurality of word lines are respectively connected to said cells of said column, each word line allowing, when it is activated, to select the memory cell(s) of a given row of SRAM cells among said rows of SRAM cells, the setting circuit further comprising a stage for simultaneous activation of said word lines to, during the second phase of said first setting mode, carry out, via a second control signal, maintain a simultaneous activation of said word lines of said group of cells.

5. The static random access memory device according to claim 1, wherein the setting circuit comprises:
   a first bias line capable, when it is coupled to the first bit line, of imposing a first bias potential or a first bias current onto the first bit line,
   a first transistor for coupling between the first bias line and the first bit line controlled by a first control signal,
   a second bias line capable, when it is coupled to the second bit line, of imposing a second bias potential or a second bias current onto the second bit line, and
   a second coupling transistor arranged between the second bias line and the second bit line and controlled by a second control signal.

6. The static random access memory device according to claim 5, wherein the first coupling transistor is provided to alternatingly couple the first bias line to the first bit line or decouple the first bias line from the first bit line, the second coupling transistor being provided to alternatingly couple the second bias line to the second bit line or decouple the second bias line from the second bit line, so that:
   during the first erasing phase of the first setting mode and the third erasing phase of the second setting mode: the first bias line and the second bias line are decoupled respectively from the first bit line and from the second bit line,
   during the second phase of the first setting mode: the first bias line is coupled to the first bit line while the second bias line is decoupled from the second bit line or the first bias line is decoupled from the first bit line while the second bias line is coupled to the second bit line,
   during the fourth phase of the second setting mode, the first bias line is decoupled from the first bit line while the second bias line is decoupled from the second bit line.

7. The static random access memory device according to claim 1, wherein during the second phase of the first setting mode one of said first bit line and second bit line is set to the power supply potential while the other of said first bit line and second bit line is left floating or grounded or set to a potential lower than the reference potential acting as a ground.

8. The static random access memory device according to claim 5, wherein the first bias line and the second bias line are set to the power supply potential.

9. The static random access memory device according to claim 5, wherein the first coupling transistor has a size W1/L1 and wherein the second coupling transistor has a size W2/L2 different than that of the first coupling transistor and/or wherein at least one of said first bias potential and second bias potential is provided at a value $\Delta V$ such that:
   $GND<\Delta V<VDD$ and in particular such that $GND<\Delta V<VDD/10$.

10. The static random access memory device according to claim 1, wherein the setting circuit is provided with a logic control block capable of receiving a first triggering signal for triggering the first setting mode and a signal for triggering the second setting mode and of producing consecutively to the reception of the first triggering signal a first sequence of control signals, placing the setting circuit in the first setting mode, and of producing consecutively to the reception of the second triggering signal a second sequence of said control signals, distinct from the first sequence and placing the setting circuit in the second setting mode.

11. The static random access memory device according to claim 10, wherein among said first and second sequences of control signals there is:
   a first control signal for, when the first control signal is in a first state, controlling a connection of the bit lines to each other and a disconnection between the high power supply line and said power supply and, when the first control signal is in a second state, controlling a disconnection of the bit lines from one another and a connection of the high power supply line to said power supply, and
   a second control signal for, when the second control signal is in a first state, controlling a simultaneous activation of the word lines, when the second control signal is in a second state, controlling a simultaneous deactivation of the word lines.

12. The static random access memory device according to claim 11, wherein the logic control block is provided with a first multiplexer and with a second multiplexer, respectively producing the first control signal and the second control signal, a first input of the first multiplexer being connected to a second input of the second multiplexer and receiving an erasing signal, the state of which depends on the first triggering signal and on the second triggering signal, a second input of the first multiplexer being connected to a first input of the second multiplexer, and receiving the erasing signal with a predetermined delay, the second triggering signal forming a selection signal shared by the first multiplexer and the second multiplexer.

13. The static random access memory device according to claim 10, wherein a change of state of the second triggering signal is consecutive to a detection of fraudulent access to the memory device.

14. The static random access memory device according to claim 10, wherein a change of state of the first triggering signal is consecutive to an emission of a signal coming from a module configured to generate a digital signature and/or an encryption key and/or a random number.

15. The static random access memory device according to claim 1, wherein during the first phase of the first setting mode and the third phase of the second setting mode, the high power supply line is decoupled from a power supply at the power supply potential, so as to not power the first inverter and the second inverter,
   and wherein during the second phase of the first mode and the fourth phase of the second setting mode, the high-power supply line is coupled to the power supply at the power supply potential, so as to power the first inverter and the second inverter.

16. The static random access memory device according to claim 1, wherein the device is configured to generate a digital signature and/or an encryption key and/or a random number.

17. A method for controlling the static random access memory device according to claim 9, wherein:
during a first setting step according to the first setting mode, at least one given bias line out of said bias lines is set to a given bias potential $\Delta V1$ between the reference potential and the power supply potential and in particular such that $\Delta V1<VDD/10$, then
during a second setting step according to the first setting mode, said given bias line is set to a bias potential $\Delta V2$ different than the given bias potential and between the reference potential and the power supply potential and in particular such that $\Delta V2<VDD/10$.

* * * * *